US012769910B2

(12) United States Patent
Hirech et al.

(10) Patent No.: US 12,769,910 B2
(45) Date of Patent: Oct. 20, 2026

(54) SYSTEM AND METHOD FOR AREA AND TIMING ASSESSMENT OF A NETWORK-ON-CHIP (NoC) IMPLEMENTATION

(71) Applicant: ARTERIS, INC., Campbell, CA (US)

(72) Inventors: Mokhtar Hirech, Sunnyvale, CA (US); Benoit de Lescure, Campbell, CA (US)

(73) Assignee: ARTERIS, INC., Campbell, CA (US)

( * ) Notice: Subject to any disclaimer, the term of this patent is extended or adjusted under 35 U.S.C. 154(b) by 966 days.

(21) Appl. No.: 17/903,992

(22) Filed: Sep. 6, 2022

(65) Prior Publication Data

US 2023/0101972 A1 Mar. 30, 2023

Related U.S. Application Data

(60) Provisional application No. 63/250,210, filed on Sep. 29, 2021.

(51) Int. Cl.

*G06F 30/327* (2020.01)
*G06F 30/3312* (2020.01)
*G06F 30/3323* (2020.01)

(52) U.S. Cl.

CPC ........ *G06F 30/327* (2020.01); *G06F 30/3312* (2020.01); *G06F 30/3323* (2020.01)

(58) Field of Classification Search

USPC .......................................................... 716/103

See application file for complete search history.

(56) References Cited

U.S. PATENT DOCUMENTS

| | | | |
|---|---|---|---|
| 5,485,396 | A | 1/1996 | Brasen et al. |
| 5,541,849 | A | 7/1996 | Rostoker et al. |
| 5,623,420 | A | 4/1997 | Yee et al. |
| 5,638,288 | A | 6/1997 | Deeley |
| 5,761,078 | A | 6/1998 | Fuller et al. |
| 5,887,670 | A | 3/1999 | Tabata et al. |
| 5,903,886 | A | 5/1999 | Heimlich et al. |
| 5,983,277 | A | 11/1999 | Heile et al. |
| 6,002,857 | A | 12/1999 | Ramachandran |
| 6,134,705 | A | 10/2000 | Pedersen et al. |
| 6,145,117 | A | 11/2000 | Eng |
| 6,249,902 | B1 | 6/2001 | Gusa et al. |

(Continued)

FOREIGN PATENT DOCUMENTS

| | | | |
|---|---|---|---|
| CN | 105187313 | B | 5/2018 |
| CN | 109587081 | A | 4/2019 |

(Continued)

OTHER PUBLICATIONS

U.S. Appl. No. 17/134,384, filed Dec. 26, 2020, Federico Angiolini.

(Continued)

*Primary Examiner* — Mohammed Alam

(74) *Attorney, Agent, or Firm* — Dana Legal Services; Jubin Dana

(57) ABSTRACT

A system and method for implementing and generating a network-on-chip (NoC) topology based on area and timing assessment. A topology of the NoC is defined, approximations of area and timing of the topology without optimization are performed; and an exact, complete register transfer level (RTL) description of the topology is generated if the approximated area and timing satisfy constraints.

4 Claims, 13 Drawing Sheets

(56) References Cited

U.S. PATENT DOCUMENTS

| | | | |
|---|---|---|---|
| 6,321,363 B1 | 11/2001 | Huang et al. | |
| 6,360,356 B1 | 3/2002 | Eng | |
| 6,378,121 B2 | 4/2002 | Hiraga | |
| 6,421,321 B1 | 7/2002 | Sakagawa et al. | |
| 6,437,804 B1 | 8/2002 | Ibe et al. | |
| 6,449,761 B1 | 9/2002 | Greidinger et al. | |
| 6,622,225 B1 | 9/2003 | Kessler et al. | |
| 6,883,455 B2 | 4/2005 | Maeda et al. | |
| 6,907,591 B1 | 6/2005 | Teig et al. | |
| 7,096,436 B2 | 8/2006 | Bednar et al. | |
| 7,398,497 B2 | 7/2008 | Sato et al. | |
| 7,587,687 B2 | 9/2009 | Watanabe et al. | |
| 7,788,625 B1 | 8/2010 | Donlin et al. | |
| 8,042,087 B2 * | 10/2011 | Murali | G06F 30/30 370/293 |
| 8,302,041 B1 | 10/2012 | Chan et al. | |
| 8,819,611 B2 | 8/2014 | Philip et al. | |
| 9,184,998 B2 | 11/2015 | Xue | |
| 9,262,359 B1 | 2/2016 | Noice et al. | |
| 9,444,702 B1 | 9/2016 | Raponi et al. | |
| 9,569,574 B1 | 2/2017 | Khan et al. | |
| 9,792,397 B1 | 10/2017 | Nagaraja | |
| 9,825,779 B2 | 11/2017 | Ruymbeke et al. | |
| 9,940,423 B2 | 4/2018 | Lescure | |
| 10,068,047 B1 | 9/2018 | Finn | |
| 10,282,502 B1 | 5/2019 | BShara et al. | |
| 10,348,563 B2 | 7/2019 | Rao et al. | |
| 10,460,062 B2 | 10/2019 | Feld et al. | |
| 10,733,350 B1 | 8/2020 | Prasad et al. | |
| 10,853,545 B1 | 12/2020 | Nardi et al. | |
| 10,922,471 B2 | 2/2021 | Baeckler et al. | |
| 10,990,724 B1 | 4/2021 | Cherif et al. | |
| 11,121,933 B2 | 9/2021 | Cherif et al. | |
| 11,281,827 B1 | 3/2022 | Labib et al. | |
| 11,449,655 B2 | 9/2022 | Cherif et al. | |
| 2003/0093765 A1 | 5/2003 | Lam et al. | |
| 2004/0040007 A1 | 2/2004 | Harn | |
| 2004/0230919 A1 | 11/2004 | Balasubramanian et al. | |
| 2005/0073316 A1 | 4/2005 | Graham | |
| 2005/0268258 A1 | 12/2005 | Decker | |
| 2007/0156378 A1 | 7/2007 | McNamara | |
| 2007/0157131 A1 | 7/2007 | Watanabe et al. | |
| 2007/0174795 A1 | 7/2007 | Lavagno et al. | |
| 2007/0186018 A1 | 8/2007 | Radulescu et al. | |
| 2008/0046854 A1 | 2/2008 | Tang | |
| 2008/0049753 A1 | 2/2008 | Heinze et al. | |
| 2008/0279183 A1 | 11/2008 | Wiley et al. | |
| 2008/0291826 A1 | 11/2008 | Licardie et al. | |
| 2009/0031277 A1 | 1/2009 | Mcelvain et al. | |
| 2009/0313592 A1 * | 12/2009 | Murali | G06F 30/30 716/113 |
| 2010/0061352 A1 | 3/2010 | Fasolo et al. | |
| 2010/0162189 A1 | 6/2010 | Lavagno et al. | |
| 2010/0218146 A1 | 8/2010 | Platzker et al. | |
| 2010/0274785 A1 | 10/2010 | Procopiuc et al. | |
| 2011/0170406 A1 | 7/2011 | Krishnaswamy | |
| 2012/0013509 A1 | 1/2012 | Wisherd et al. | |
| 2012/0311512 A1 * | 12/2012 | Michel | G06F 30/3315 716/104 |
| 2013/0174113 A1 | 7/2013 | Ecler et al. | |
| 2013/0208598 A1 | 8/2013 | Nakaya et al. | |
| 2013/0258847 A1 | 10/2013 | Zhang et al. | |
| 2013/0283226 A1 | 10/2013 | Ho et al. | |
| 2014/0115218 A1 | 4/2014 | Philip et al. | |
| 2014/0126572 A1 | 5/2014 | Hutton et al. | |
| 2014/0153575 A1 | 6/2014 | Munoz | |
| 2014/0156826 A1 | 6/2014 | Chang et al. | |
| 2014/0160939 A1 | 6/2014 | Arad et al. | |
| 2014/0169173 A1 | 6/2014 | Naouri et al. | |
| 2014/0204735 A1 | 7/2014 | Kumar et al. | |
| 2014/0211622 A1 | 7/2014 | Kumar et al. | |
| 2014/0298281 A1 | 10/2014 | Varadarajan et al. | |
| 2014/0321839 A1 | 10/2014 | Armstrong | |
| 2015/0036536 A1 | 2/2015 | Kumar et al. | |
| 2015/0106778 A1 | 4/2015 | Mangano et al. | |
| 2015/0121319 A1 | 4/2015 | Hutton et al. | |
| 2015/0178435 A1 | 6/2015 | Kumar | |
| 2015/0254325 A1 | 9/2015 | Stringham | |
| 2015/0341224 A1 | 11/2015 | Van et al. | |
| 2015/0347641 A1 | 12/2015 | Gristede et al. | |
| 2016/0103943 A1 | 4/2016 | Xia et al. | |
| 2016/0275213 A1 | 9/2016 | Tomita | |
| 2016/0321390 A1 | 11/2016 | Bozman et al. | |
| 2017/0060204 A1 | 3/2017 | Gangwar et al. | |
| 2017/0063734 A1 | 3/2017 | Kumar | |
| 2017/0132350 A1 * | 5/2017 | Janac | G06F 30/398 |
| 2017/0177778 A1 | 6/2017 | Lescure | |
| 2017/0193136 A1 | 7/2017 | Prasad et al. | |
| 2018/0115487 A1 | 4/2018 | Thubert et al. | |
| 2018/0144071 A1 | 5/2018 | Yu et al. | |
| 2018/0227180 A1 * | 8/2018 | Rao | G06F 15/76 |
| 2019/0012909 A1 | 1/2019 | Mintz | |
| 2019/0073440 A1 | 3/2019 | Farbiz et al. | |
| 2019/0205493 A1 | 7/2019 | Garibay et al. | |
| 2019/0246989 A1 | 8/2019 | Genov et al. | |
| 2019/0251227 A1 | 8/2019 | Fink | |
| 2019/0260504 A1 | 8/2019 | Philip et al. | |
| 2019/0363789 A1 | 11/2019 | Lee et al. | |
| 2020/0092230 A1 | 3/2020 | Schultz et al. | |
| 2020/0162335 A1 | 5/2020 | Chen et al. | |
| 2020/0234582 A1 | 7/2020 | Mintz | |
| 2020/0366607 A1 | 11/2020 | Kommula et al. | |
| 2021/0203557 A1 | 7/2021 | Cherif et al. | |
| 2021/0226887 A1 | 7/2021 | Mereddy | |
| 2021/0320869 A1 | 10/2021 | Bourai et al. | |
| 2021/0409284 A1 | 12/2021 | Cherif et al. | |
| 2022/0207226 A1 * | 6/2022 | Angiolini | G06F 30/327 |
| 2022/0294704 A1 | 9/2022 | Lescure et al. | |

FOREIGN PATENT DOCUMENTS

| | | |
|---|---|---|
| CN | 113051215 A | 6/2021 |
| CN | 113055219 A | 6/2021 |
| DE | 102015014851 A1 | 5/2016 |
| EP | 3842987 A1 | 6/2021 |
| EP | 4024262 A1 | 7/2022 |
| EP | 4057179 A1 | 9/2022 |

OTHER PUBLICATIONS

U.S. Appl. No. 17/665,578, filed Feb. 6, 2022, K. Charles Janac.

“A distributed interleaving scheme for efficient access to wideIO dram memory”, Seiculescu Ciprian, Benini Luca, De Micheli Giovanni, CODES+ISSS'12 (Year: 2012).

“Thread-Fair Memory Request Reordering”; Kun Fang, Nick Iliev, Ehsan Noohi, Suyu Zhang, and Zhichun Zhu; Dept. of ECE, Univeristy of Illinois at Chicago; JWAC-3 Jun. 9, 2012.

19th Asia and South Pacific Design Automation Conterence Alberto Ghiribaldi, Hervé Tatenguem Fankem, Federico Angiolini, Mikkel Stensgaard, Tobias Bjerregaard, Davide Bertozzi A Vertically Integrated and Interoperable Multi-Vendor Synthesis Flow for Predictable NoC Design in Nanoscale Technologies.

ACM ICCAD '06 Srinivasan Murali, Paolo Meloni, Federico Angiolini, David Atienza, Salvatore Carta, Luca Benini, Giovanni De Micheli, Luigi Raffo Designing Application-Specific Networks on Chips with Floorplan Information p. 8, Figure 8.

Alessandro Pinto et al, “System level design paradigms”, ACM Transactions on Design Automation of Electronic Systems, ACM, New York, NY, US, (Jun. 7, 2004), vol. 11, No. 3, doi:10.1145/1142980.1142982, ISSN 1084-4309, pp. 537-563, XP058222500.

Annual IEEE International SoC Conference Proceedings Mohammad reza Kakoee, Federico Angiolin, Srinivasan Murali, Antonio Pullini, Ciprian Seiculescu, and Luca Benini A Floorplan-aware Interactive Tool Flow for NoC Design and Synthesis pp. 1, 2, 4 2009 Belfast, Northern Ireland, UK.

Bo Huang et al, “Application-Specific Network-on-Chip synthesis with topology-aware floorplanning”, Integrated Circuits and Systems Design (SBCCI), 2012 25th Symposium on, IEEE, (Aug. 30, 2012), doi:10.1109/SBCCI.2012.6344421, ISBN 978-1-4673-2606-3, pp. 1-6, XP032471227.

(56) References Cited

OTHER PUBLICATIONS

David Atienza et al, Network-on-Chip Design and Synthesis Outlook, Science Direct, Integration the VLSI, journal 41 (2008) 340-359.
Dumitriu Vet al: "Throughput-Oriented Noc Topology Generation and Analysis for High Performance SoCs", IEEE Transactions on Very Large Scale Integration (VLSI) Systems, IEEE Service Center, Piscataway, NJ, USA, vol. 17, No. 10, Oct. 1, 2009 (Oct. 1, 2009), pp. 1433-1446, XP011267808, ISSN: 1063-8210, DOI: 10.1109/TVLSI.2008.2004592.
Fangfa Fu et al: "A Noc performance evaluation platform supporting designs at multiple levels of abstraction", Industrial Electronics and Applications, 2009. ICIEA 2009. 4th IEEE Conference on, IEEE, Piscataway, NJ, USA, May 25, 2009 (May 25, 2009), pp. 425-429, XP031482069, ISBN: 978-1-4244-2799-4 *abstract* * p. 426-p. 429 *.
Francesco Robino: "A model-based design approach for heterogeneous NoC-based MPSoCs on FPGA", Jul. 1, 2014 (Jul. 1, 2014), XP002806918, Retrieved from the Internet: URL: http://www.divaportal.org/smash/get/diva2:718518/FULLTEXT02.pdf [retrieved on Jun. 22, 2022].
Jean-Jacques Lecler et al: Application driven network-on-chip architecture exploration & refinement for a complex SoC, Design Automation for Embedded Systems, vol. 15 no. 2, Apr. 7, 2011, DOI: 10.1007/S10617-011-9075-5.
K. R. Manik et al., "Methodology for Design of Optimum NOC Based on I PG," 2017 Int'l Conference on Algorithms, Methodology, Model and Applications in Emerging Technologies (ICAMMAET), Chennai, India, IEEE, 6 pages. (Year: 2017).
Luca Benini: "Application specific Noc design", Design, Automation and Test in Europe, 2006, Date '06 : Mar. 6-10, 2006, [Munich, Germany; Proceedings] / [Sponsored By the European Design and Automation Association], IEEE, Piscataway, NJ, USA, Mar. 6, 2006 (Mar. 6, 2006), pp. 491-495, XP058393584, ISBN: 9783981080100.
Murali et al: "Synthesis of Predictable Networks-on-Chip-Based Interconnect Architectures for Chip Multiprocessors", IEEE Transactions on Very Large Scale Integration (VLSI) Systems, IEEE Service Center, Piscataway, NJ, USA, vol. 15, No. 8, Aug. 1, 2007 (Aug. 1, 2007) , pp. 869-880, XP011187732, ISSN: 1063-8210, DOI: 10.1109/TVLSI.2007.900742.
Partha et al., Design, Synthesis, and Test of Networks on Chips, IEEE (Year: 2005).
Picornell Tomas tompic@gap.upv.es et al: "DCFNoC A Delayed Conflict-Free Time Division Multiplexing Network on Chip", Designing Interactive Systems Conference, ACM, 2 Penn Plaza, Suite 701 New York NY10121-0701 USA, Jun. 2, 2019 (Jun. 2, 2019), pp. 1-6, XP058637807, DOI: 10.1145/3316781.3317794 ISBN: 978-1-4503-5850-7.
Srinivasan K et al, "Linear programming based techniques for synthesis of network-on-chip architectures", Computer Design: VLSI in Computers and Processors, 2004. ICCD 2004. Pr oceedings. IEEE International Conference on San Jose, CA, USA Oct. 11-13, 2004, Piscataway, NJ, USA, IEEE, (Oct. 11, 2004), doi:10.1109/ICCD.2004.1347957, ISBN 978-0-7695-2231-9, pp. 422-429, XP010736641.
Srinivasan Murali et al: "Mapping and physical planning of networks-on-chip architectures with quality-of- service guarantees", Proceedings of the 2005 Asia and South Pacific Design Automation Conference, Jan. 18, 2005, DOI: 10.1145/1120725.1120737.
Tobias Bjerregaard et al: "A Router Architecture for Connection-Oriented Service Guarantees in the MANGO Clockless Network-on-Chip", Proceedings of the IEEE Conference and Exhibition on Design, Automation, and Test in Europe, Mar. 7, 2005, DOI: 10.1109/DATE.2005.36.
Wei Zhong et al: "Floorplanning and Topology Synthesis for Application-Specific Network-on-Chips", IEICE Transactions on Fundamentals of Electronics< Communications and Computer Sciences, Jun. 1, 2013, DOI: 10.1587/TRANSFUN.E96.A.1174.
Zhou Rongrong et al: A Network Components Insertion Method for 3D Application-Specific Network-on-Chip, Proceedings of the 11th IEEE International Conference on ASIC, Nov. 3, 2015, pp. 1-4, DOI: 10.1109/ASICON.2015.7516952.
Anonymous: "Intel Hyperflex Architecture HighPerformance Design Handbook", Oct. 4, 2021 (Oct. 4, 2021), pp. 1-147, XP093063924, Retrieved from the Internet: URL:https://cdrdv2.intel.com/vl/dl/getContent/667078?fileName=sl0_hp_hb-683353-667078.pdf.
James C. Tiernan. 1970. An efficient search algorithm to find the elementary circuits of a graph. Commun. ACM 13, 12 (Dec. 1970), 722-726. https://doi.org/10.1145/362814.362819.
Ken Eguro et al: "Simultaneous Retiming and Placement for Pipelined Net lists", Proceedings of the 16th International Symposium on Field-Programmable Custom Computing Machines, Apr. 14, 2008 (Apr. 14, 2008), pp. 139-148, XP031379339.
Anonymous: "Network on a chip—Wikipedia", Jun. 15, 2021, https://en.wikipedia.org/w/index.php?title-Network_on_a_chip&oldid-1028654828.
Haytham Elmiligi et al: "Networks-on-chip topology optimization subject to power, delay, and reliability constraints", IEEE International Symposium on Circuits and Systems, May 30, 2010, pp. 2354-2357 DOI: 10.1109/ISCAS.2010.5537194.
Jain R. et al: "Predicting system-level area and delay for pipelined and nonpipelined designs", IEEE Transactions on Computer Aided Design of Integrated Circuits and Systems, vol. 11, No. 8, Jan. 1, 1992, pp. 955-965, DOI: 10. 1109/43.149767.
Jingye Xu et al: "Latch Based Interconnect Pipelining For High Speed Integrated Circuits", Proceedings of the International Conference on Electro/Information Technology, May 1, 2006, pp. 295-300 DOI: 10.1109/EIT.2006.252152.
Jun Minje et al: "Exploiting Implementation Diversity and Partial Connection of Routers in Application-Specific Network-on-Chip Topology Synthesis", IEEE Transactions on Computers, IEEE, USA, vol. 63, No. 6, Jun. 1, 2014 (Jun. 1, 2014), pp. 1434-1445, XP011550397, ISSN: 0018-9340, DOI: 10.1109/TC.2012.294.
Saponara S et al: "Design and coverage-driven verification of a novel network-interface IP macrocell for network-on-chip interconnects", Microprocessors and Microsystems, vol. 35, No. 6 , pp. 579-592, XP028255708 ISSN: 0141-9331, DOI: 10.1016/J.MICPRO, 2011.06.005.
Saponara Sergio et al: "Configurable network-on-chip router macrocells", Microprocessors and Microsystems, IPC Business Press Ltd. London, GB, vol. 45, Apr. 29, 2016 (Apr. 29, 2016), pp. 141-150, XP029678799, ISSN: 0141-9331, DOI: 10.1016/J.MICPRO.2016.04.008.
Song Z et al: "A NoC-Based High Performance Deadlock Avoidance Routing Algorithm", Computer and Computational Sciences, 2008. IMSCCS '08, International Multisymposiums on, IEEE Piscataway, NJ, USA, Oct. 18, 2008, pp. 140-143, XP031411025, ISBN: 978-0-7695-3430-5.
Chaari Moomen Moomen Chaari@Infineon Com et al: "A model-based and simulation-assisted FMEDA approach for safety-relevant E/E systems", Proceedings of the 34th ACM SIGMOD-SIGACT-SIGAI Symposium on Principles of Database Systems, ACMPUB27, New York, NY, USA, Jun. 7, 2015 (Jun. 7, 2015), pp. 1-6, XP058511366, DOI: 10.1145/2744769.2747908 ISBN: 978-1-4503-3550-8.
Mariani R et al: "Fault-Robust Microcontrollers for Automotive Applications", On-Line Testing Symposium, 2006. IOLTS 2006. 12th IEEE International Como, Italy Jul. 10-12, 2006, Piscataway, NJ, USA,IEEE, Jul. 10, 2006 (Jul. 10, 2006), pp. 213-218, XP010928275, DOI: 10.1109/IOLTS.2006.38 ISBN: 978-0-7695-2620-1.

* cited by examiner

710

```
pipe_adapter_a req_pipe0 (
.mainRegime_Cm_root_clk (mainRegime_Cm_root_clk),
.mainRegime_Cm_root_reset_n (mainRegime_Cm_root_reset_n),
.mainRegime_Cm_root_test_en (mainRegime_Cm_root_test_en),
.I0_valid (link_wdtAd_Z0__req_pipe0_I0_valid),
.I0_ready (link_wdtAd_Z0__req_pipe0_I0_ready),
.I0_first (link_wdtAd_Z0__req_pipe0_I0_first),
.I0_last (link_wdtAd_Z0__req_pipe0_I0_last),
.I0_bus (link_wdtAd_Z0__req_pipe0_I0_bus),
.Z0_valid (req_pipe0_Z0__req_sw0_I0_valid),
.Z0_ready (req_pipe0_Z0__req_sw0_I0_ready),
.Z0_first (req_pipe0_Z0__req_sw0_I0_first),
.Z0_last (req_pipe0_Z0__req_sw0_I0_last),
.Z0_bus (req_pipe0_Z0__req_sw0_I0_bus)
);
```

FIG. 7

SYSTEM AND METHOD FOR AREA AND TIMING ASSESSMENT OF A NETWORK-ON-CHIP (NoC) IMPLEMENTATION

CROSS REFERENCE TO RELATED APPLICATIONS

The present application claims the benefit of U.S. PROVISIONAL APPLICATION Ser. No. 63/250,210 filed on Sep. 29, 2021 by Benoit de LESCURE et al. and titled SYSTEM AND METHOD FOR AREA AND TIMING ASSESSMENT OF A NETWORK-ON-CHIP (NoC) IMPLEMENTATION, the entire disclosure of which is incorporated herein by reference.

FIELD

The present technology is in the field of computer aided design tools, and more specifically, related to network-on-chip (NoC) implementations.

BACKGROUND

Network-on-chip (NoC) technology is being used at many semiconductor companies to support an ever-increasing number of cores on a single chip and a demand for ever-increasing processing power related to artificial intelligence (AI) and other applications. A NoC is superior to point-to-point connectivity by way of a more scalable communication architecture that makes use of packet transmissions.

Consider the design of a system-on-chip (SoC) that includes a NoC. Register Transfer Level (RTL) may be used for design and verification flow of the SoC. An SoC specification provides a chip definition of technology, domains, constraints, and layout, including real estate and other constraints for the NoC. A designer of the NoC generates a synthesizable RTL description of a NoC that will fit into that real estate and that will have predictable results about operation frequency and other factors such as routing congestion, and power consumption. The RTL description of the NoC is delivered to an SoC integrator, which determines whether the NoC satisfies the constraints placed upon it. If the NoC is found to violate any constraints, the NoC designer modifies the design of the NoC, generates a new RTL description of the NoC, and delivers that new description to the SoC integrator for re-evaluation. Several iterations might occur before the NoC satisfies all constraints.

Mitigating the design issues of the NoC in this manner comes with a very expensive price tag as it could negatively impact the overall design schedule.

SUMMARY

In accordance with various embodiments and aspects herein, systems and methods are disclosed for designing a network-on-chip (NoC). A topology of the NoC is defined, approximations of area and timing of the topology without optimization are performed; an exact, complete register transfer level (RTL) description of the topology is generated if the approximated area and timing satisfy constraints.

BRIEF DESCRIPTION OF THE DRAWINGS

In order to understand the invention more fully, a reference is made to the accompanying drawings. The aspects and embodiments in the following description are described with reference to the drawings or figures (FIG.), in which like numbers represent the same or similar elements. Understanding that these drawings are not to be considered limitations in the scope of the claims, the presently described aspects and embodiments and the presently understood best mode of the invention are described with additional detail through the use of the accompanying drawings.

FIG. 7 shows a transport interface on a pipe adapter in accordance with various aspects and embodiments of the invention.

DETAILED DESCRIPTION

Additionally, it is intended that such equivalents include both currently known equivalents and equivalents developed in the future, i.e., any elements developed that perform the same function, regardless of structure. It is noted that the specific examples provided are for illustration purpose and not as a limitation of the invention. It is noted that, as used herein, the singular forms "a," "an" and "the" include plural referents unless the context clearly dictates otherwise. Reference throughout this specification to "one aspect," "another aspect," "one embodiment," "an embodiment," "certain embodiment," or similar language means that a particular aspect, feature, structure, or characteristic described in connection with the embodiment is included in at least one embodiment of the invention. Thus, appearances of the phrases "in one aspect," "in one embodiment," "in at least one embodiment," "in an embodiment," "in some embodiments," and similar language throughout this specification may, but do not necessarily, all refer to the same embodiment or similar embodiments.

The described features, structures, or characteristics of the invention may be combined in any suitable manner in accordance with the aspects and one or more embodiments of the invention. In the following description, numerous specific details are recited to provide an understanding of various embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring the aspects of the invention.

The following describes various aspects and embodiments of the present technology. Generally, examples can use the described aspects and embodiments in any combination. All statements herein reciting principles, aspects, and embodiments, as well as specific examples thereof, are intended to encompass both structural and functional equivalents thereof. The examples provided are intended as non-limiting examples. Additionally, it is intended that such equivalents include both currently known equivalents and equivalents developed in the future, i.e., any elements developed that perform the same function, regardless of structure.

Figure 1:
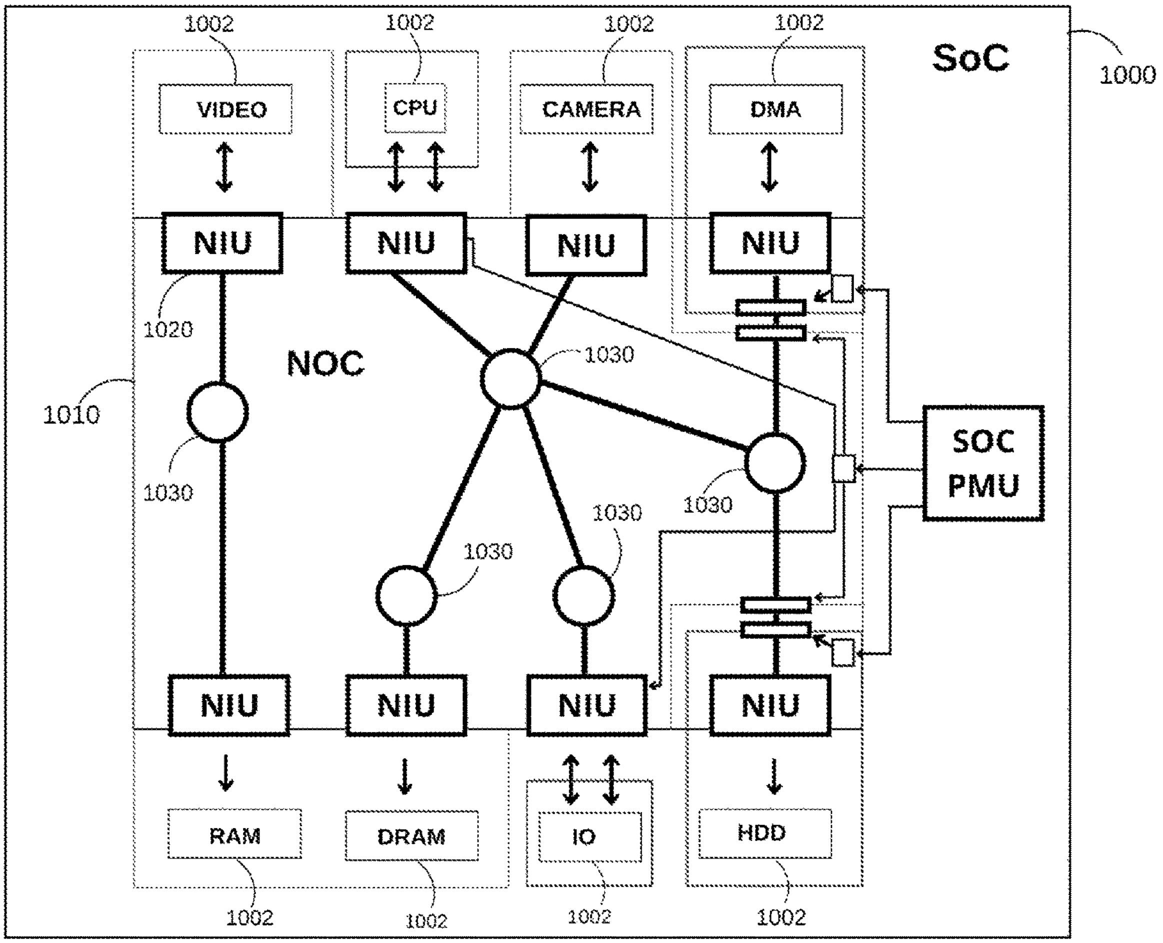
FIG. 1 shows a system on chip (SoC) that includes a network-on-chip (NoC) in accordance with various aspects and embodiments of the invention.

Reference is made to FIG. 1, which illustrates a system-on-chip (SoC) 1000 that includes a network-on-chip (NoC) 1010. The SoC 1000 also includes a plurality of cores 1002, such as video card, central processing unit (CPU), camera, direct memory access (DMA), random access memory (RAM), dynamic random access memory (DRAM), input/output (IO), and hard disk drive (HDD). The NoC 1010 provides packet-based communication between the cores 1002.

As shown in FIG. 1, the NoC 1010 includes a plurality of network interface units (NIUs) 1020, which interface with the cores 1002. These NIUs 1020 are responsible for translating several supported protocols and data sizes to and from a packet transport protocol.

The NoC 1010 further includes other components, such as edges (links), switches (nodes) 1030, width adapters, firewalls, clock adapters, rate adapters, link probes, etc. Switches and edges are used to route and carry flows of traffic between source and destination cores. Adapters deal with various conversions between data width, clock, and power domains (e.g., CPU power domain). Buffers are used to insert pipelining elements to span long distances or store packets to deal with rate adaptation between fast senders and slow receivers or vice-versa. FIG. 1 also illustrates a plurality of switches 1030 in addition to the NIUs 1020.

Each component inside the NoC 1010 has one or more well-defined transport interfaces. Adapters may be added on a link when two connected components have transport interfaces of different sizes or when there is a change in packet style from one component to the other (e.g., serial to parallel or parallel to serial).

A NoC topology refers to the set of components that exist in the NoC, with their configuration, on the one hand, and the set of paths through these components describing the precise route between a source of traffic and a destination of traffic, which need to be logically connected, on the other hand.

During design of the SoC 1000, an SoC architect designs a specification that includes a floorplan for the SoC, power strategy, and constraints related to the environment (e.g., clocks and their frequencies, quality of service, and type of protocol used with macros). Among other things, the floorplan defines areas on the chip for cores and other logic. The floorplan also defines the area that will be used for the inter-connect communication (that is, the "real estate" for the NoC). The SoC architect may place additional constraints on the NoC. Examples of additional constraints include frequency, routing congestion, and power consumption.

The NoC may be designed by a party other than the SoC architect. Utilizing the method of FIGS. 2 and 3, the NoC architect can deliver a final RTL description of the NoC faster, with fewer iterations. The method takes into consideration area and timing approximation early, before the RTL description of the NoC is delivered to the SoC integrator, integrated with the RTL description of the rest of the SoC, and synthesized into gates. Guided by these approximations, modifications to the NoC topology may be made before generating a full RTL description of the SoC. This is much faster than making after-RTL modifications, while allowing a predictable RTL outcome and substantially reducing after-RTL costly correction.

Figure 2:
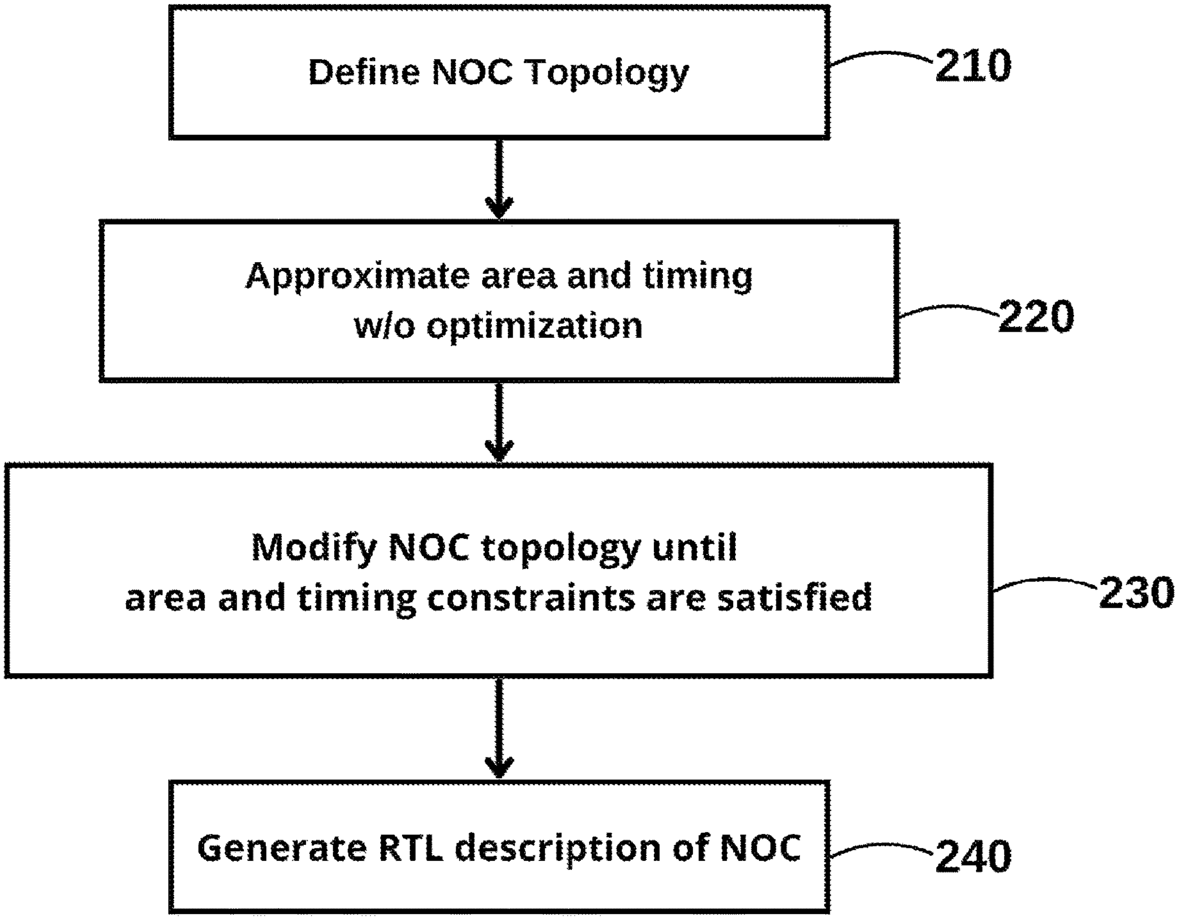
FIG. 2 shows a method of generating an RTL description of a NoC in accordance with various aspects and embodiments of the invention.
Figure 3:
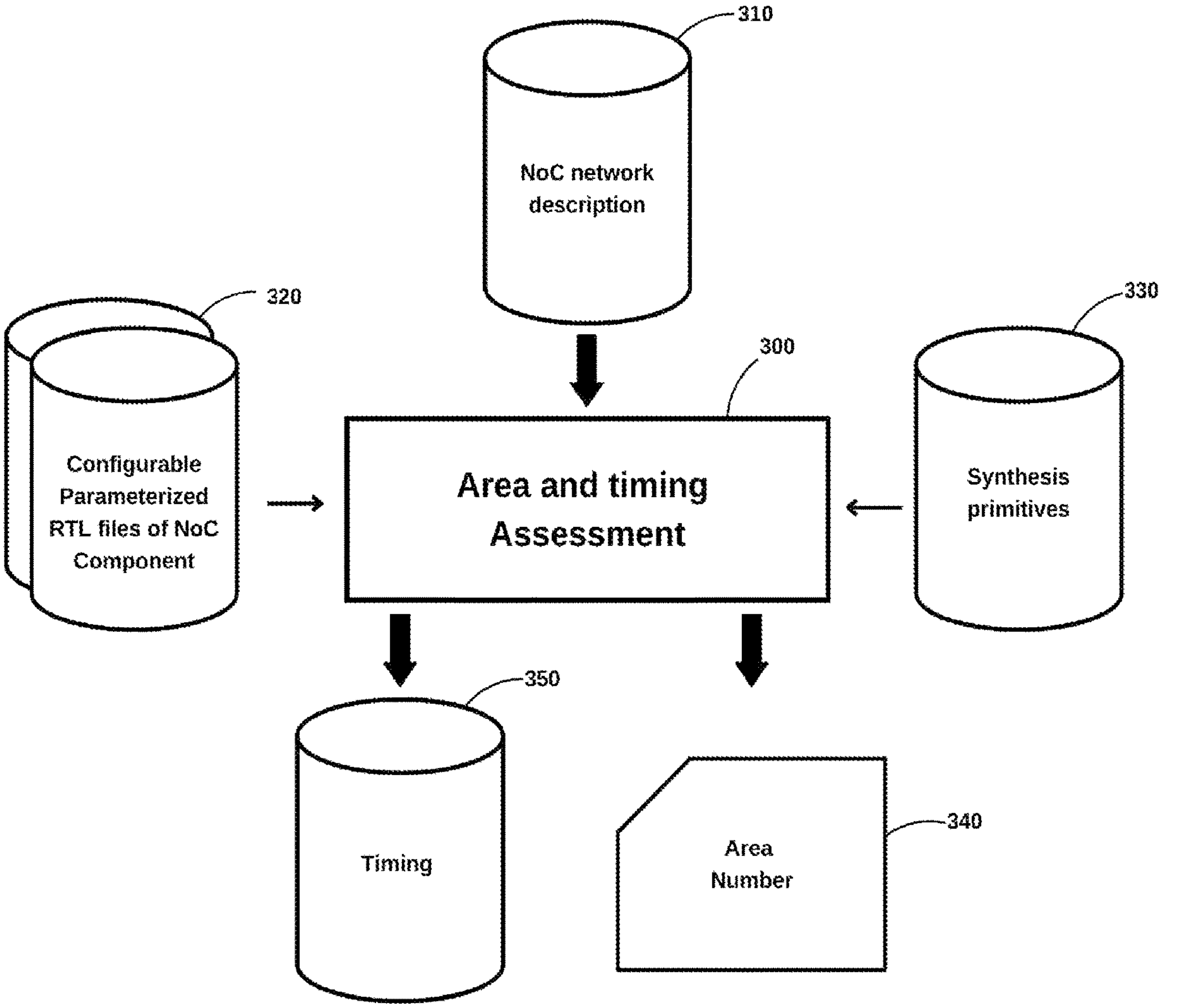
FIG. 3 shows a module for generating an approximation of NoC area and timing for the method of FIG. 2 in accordance with various aspects and embodiments of the invention.

Reference is now made to FIGS. 2 and 3, which illustrate a method performed for generating an RTL description of the NoC in accordance with various aspects and embodiments of the invention. At block 210, a topology of the NoC is defined. The topology may be defined by a full NoC network description 310 and a set 320 of configurable parameters of NoC components that define an initial configuration of the components in the description. The full NoC description 310 may be supplied to a module 300 as a computer-readable file or files describing the structure of the NoC in term of its elementary components, and how they are connected to each other.

As for the set of configurable parameters 320, some parameters may specify topology, data width, packet style and configuration of pipeline registers in accordance with various aspects and embodiments of the invention. Other parameters may specify how the components are connected (e.g., mesh, ring, crossbar, etc.), and enable/disable specific features based on user requirements in accordance with various aspects and embodiments of the invention. In accordance with various aspects and embodiments of the invention. The parameter set 320 may be supplied to the module 300 as configurable parameterized RTL files of NoC components.

In general, the NoC is highly configurable. Certain components such as the NIUs and switches have many different possible configurations. Other components such as buffers have relatively fewer possible configurations. These component parameters play a major role, as parameter values can be varied to optimize the cost, performance, and power consumption of each element. The choice of parameter values is not an easy task because most of the parameters are dependent on each other and have direct impact on the generated hardware.

At block 220, an approximation of area and timing of the NoC topology is performed without optimization. Each component in the topology is approximated for area and timing independently of other components in the topology. The module 300 configures each of the components in the NoC description according to the set 320 of parameters, and maps a primitive 330 to each configured component. A library of primitives 330 is used to synthesize the components into primitive gates. The area and delay for each configured component are approximated from the primitive gates.

Area for each primitive gate may be characterized in terms of number of transistor units. The areas of the components are summed to produce an area number 340 for the NoC topology.

Propagation delay for each primitive gate may be characterized in terms of average time units. To simplify the approximation and reduce approximation time, the delay may only include delay through the primitive gates, not for wires connecting them. All combinational delay paths may be generated between IOs, IOs and registers, and between registers. A longest path of connected primitive gates is found, and the delays in the longest combinational path are summed. The timing 350 may be reported as the sum of delays in the longest combinational path. This delay is what limits the clock frequency as it is inversely proportional to the frequency.

At block 230, if the area and timing violate the constraints, (e.g., the constraints specified in the SoC specification) the topology is modified. Area and timing of the modified topology are approximated. If the approximated area and timing still violate the constraints, the topology is modified again. There might be multiple iterations of the modification and approximation until the constraints are satisfied.

At block 240, a complete register transfer level (RTL) description is provided for a NoC topology whose area and timing approximations satisfy the constraints.

If the NoC is implemented in a SoC, the RTL description may then be delivered, to the SoC integrator. It is then determined whether the NoC design fits into the real estate defined by the SoC architect, exhibits predictable results about operation frequency, and satisfies other constraints, such as routing congestion and power consumption. If not, the NoC topology is redesigned. Each determination is computationally intensive, and can take hours or days.

Still, by being aware of area and delays, the method of FIG. 2 can identify and correct major constraint violations prior to generating the full RTL description of the SoC. This, in turn, reduces the number of iterations of generating the full RTL description. As a result, minutes are spent correcting area and timing constraint violations as opposed to hours or days generating each full RTL description and then identifying and correcting the constraint violations. The time and cost of delivering a final full RTL description to the SoC integrator is dramatically reduced.

The method offers other significant advantages. The approximation can be performed without optimization. Optimization (which refers to synthesis optimization) is a computationally intensive processes of finding combinations of primitives that satisfy design constraints. It usually involves mapping the components to primitives across large technology libraries where a given primitive (such as a register or combinational gate) is available in several variations, each characterized to accommodate specific usage (e.g., drive strength, operating voltages, and size). Timing calculations are "exact" and complex models are used to estimate resistance, capacitance and transistor transfer functions to predict the actual timing on the nets of the synthesized circuit. In the case of a SoC, generating a single exact, complete RTL description can take hours or even days.

In contrast, the approximation in block 220 does not require elaborate optimization schema. A component is mapped to a primitive and synthesized into a number of primitive gates, and the approximation is based on the primitive gates. The approximation without optimization is not precise, but it has been found to correlate well with the precise area and timing resulting from optimization.

Another advantage is the use of a library that is substantially smaller than the full set of technology libraries that is used to perform synthesis with optimization. The libraries for synthesis with optimization may have more than a thousand primitives. In contrast, the library for approximation without optimization may include twenty primitives or fewer. For instance, the list of basic primitive gates might include combinational gates (inverter, buffer, 2-input AND, 2-input OR, 2-input XOR, 2-input NAND, 2-input NOR, 2-input XNOR, 2-input MUX) and sequential gates (DLATCH, DLATCHRS, DFF, DFFRS).

Still another advantage is that individual components can be identified and modified. For instance, if an NIU has been found to contribute to a timing violation, a pipeline can be enabled to reduce delays, the modified component is synthesized into primitive gates, the timing and area are approximated with respect to the gates, and it is determined whether that change resulted in the constraints being satisfied. Modifications can be made incrementally. Even if a constraint is still not satisfied, trends can be observed to determine whether the modifications are headed in the right direction.

Figure 4:
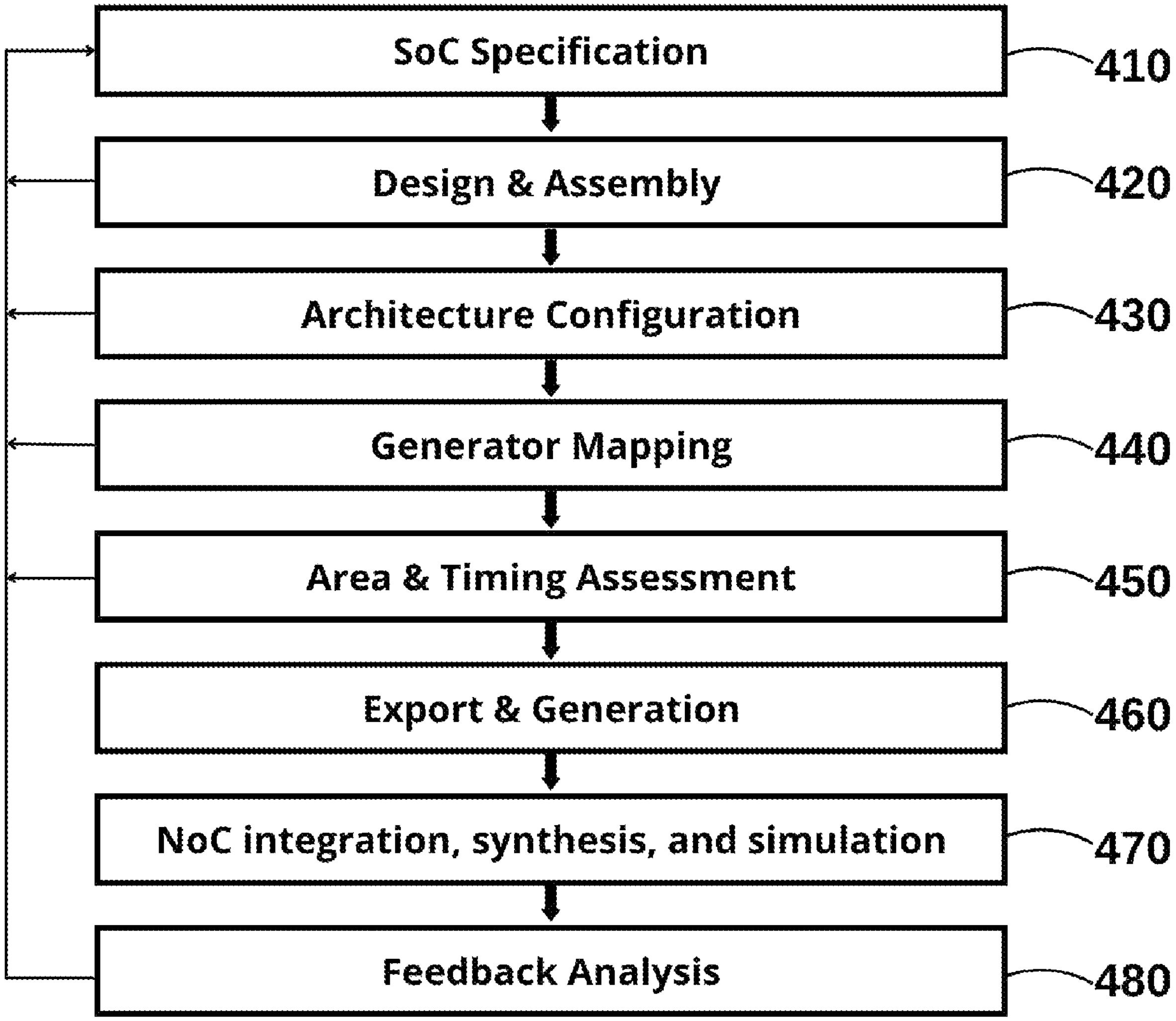
FIG. 4 shows a method of design and verification flow for a NoC implementation in accordance with various aspects and embodiments of the invention.

Reference is now made to FIG. 4, which illustrates how the method of FIGS. 2 and 3 may be used to perform design and verification flow for a NoC implementation. At block 410, an SoC specification is generated by an SoC architect. The specification provides a chip definition, technology, domains and layout for the SoC. The specification also defines the real estate for the NoC and other NoC constraints.

At block 420, a NoC architect performs NoC design and assembly. Intellectual property (IP) blocks are selected from the NoC architect's library, and the selected IP is instantiated. In addition, IP connection and assembly, sockets configuration, and end-to-performance capture may be performed. At this stage, the NoC description defines the IPs (from SoC) and their related sockets and protocols, along with the communication flows between source and targets, and memory maps.

At block 430, an architecture configuration of the NoC is generated. A coarse level topology may be generated, and Power, Performance and Area (PPA) tradeoffs may be performed (unit duplication is decided together with size of buffers in switches for example). A loop from block 430 back to block 420 helps in finalizing the architecture configuration by changing the setting of parameters, changing the connectivity scheme (e.g., from a mesh to crossbar or modified mesh), enabling of safety through unit duplication, etc. The loop goes on until the NoC architect is satisfied with the architecture (width of buses, quality of service, memory map, along many other criteria). A final architecture is produced. The network description 310 and the set 320 of configurable parameterized RTL files are made available.

At block 440, generator mapping is performed to get the NoC configured design in term of components from the NoC library, where parameters and bus sizes are defined. The generic components in the architecture configuration are mapped to components from the NoC library. A loop from block 440 back to block 420 ensures that the generic components of the NoC architecture are efficiently mapped to components from the NoC library, and that proper adapters are automatically added and configured. If the NoC architect decides to make changes to the architecture after this block, those changes are made in block 420.

At block 450, the timing and area are approximated. Area is reported as the sum of area of the gates in accordance with various aspects and embodiments of the invention. Timing is reported by identifying the longest path, and summing the delays of the gates along the longest path. If area constraints or timing constraints or both are violated, the topology is modified. Incremental modifications to components are covered by block 450. For large scale modifications, control is returned to block 420, and a different set of parameters is selected.

At block 460, export and generation are performed. The full RTL description of the NoC and all collateral files are produced. SystemC-based UVM software may be used to perform verification on the full RTL description. Implementation scripts may be generated. Performance models may also be generated.

At block 470, NoC integration, synthesis, and simulations are performed. The RTL and all collateral files of the NoC are integrated. A synthesis tool (e.g., Synopsys Design Compiler) takes these files and a standard cell library as input to produces a gate-level netlist as output. A tool for simulation and constraint solving (e.g., Synopsys VCS) may be used for verification.

At block 480, feedback analysis is performed. Feedback is derived from results of simulations, timing reports, congestion, and the like. Corrective actions, if any, are taken by looping back to block 420. The final netlist may then be used after all corrective actions are made and results are judged acceptable.

After validation is complete against the given SoC constraints, the RTL description of the NoC is delivered to the SoC integrator. There the NoC design is integrated and validated as part of the full chip.

Figure 5:
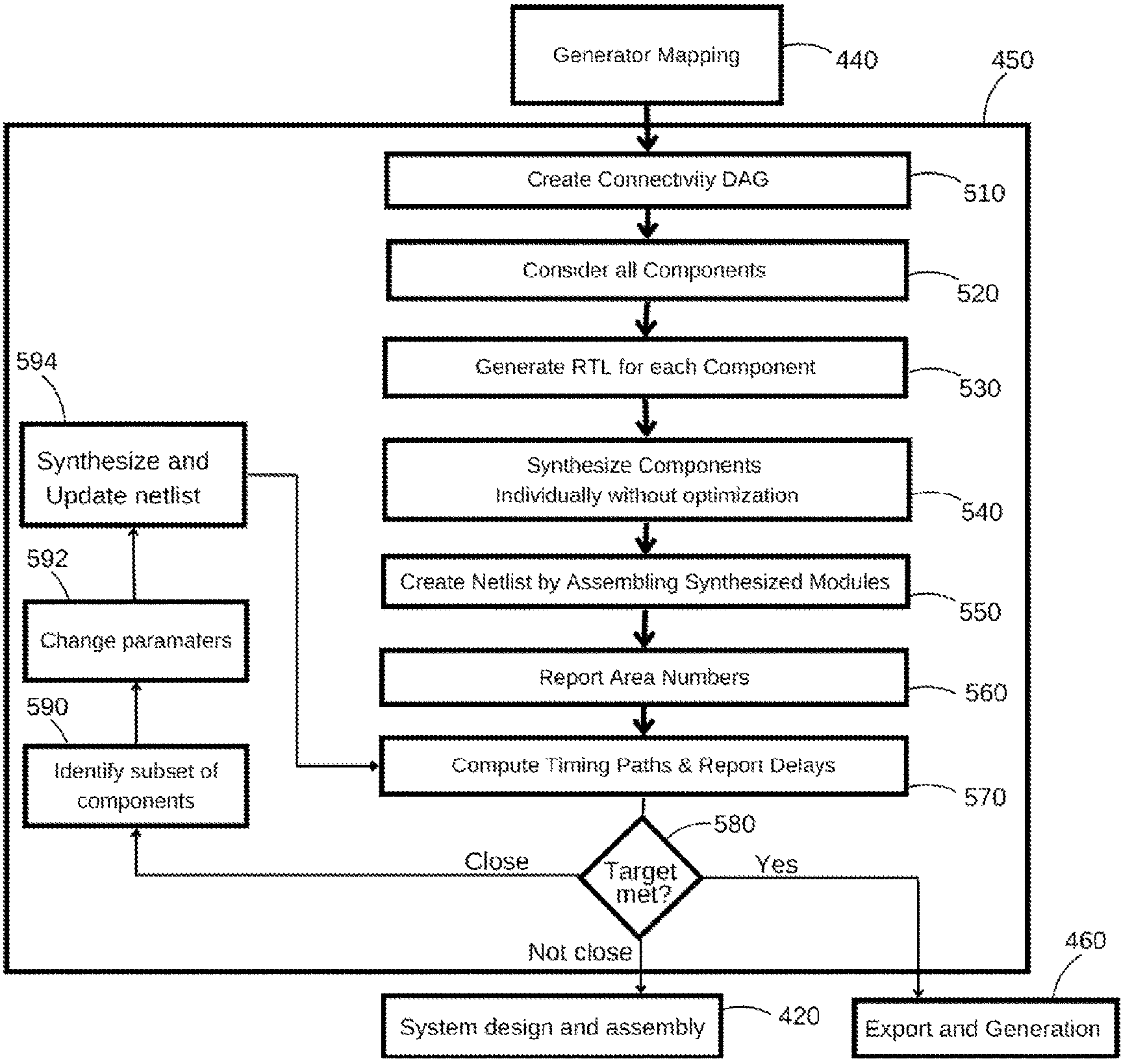
FIG. 5 shows details for generating an approximation of NoC area and timing in accordance with various aspects and embodiments of the invention.

Reference is now made to FIG. 5, which illustrates a more detailed example of generating an approximation of NoC area and timing as well as modifying the NoC topology in accordance with various aspects and embodiments of the invention. At block 510, a direct acyclic graph (DAG) is created. The DAG represents how the NoC components are connected in term of data flow. The components are connected via transport links.

At block 520, all components of the NoC are considered. In the initial run, all components in the NoC, be it switches, adapters, NIUs are considered in isolation for an RTL simplified logic synthesis and netlist creation.

At block 530, an RTL representation is generated for each component in accordance with various aspects and embodiments of the invention. Each NoC component has its RTL representation created from a description of the parametrized representation and the set of parameters values.

At block 540, a simplified synthesis is performed for each component without optimization in accordance with various aspects and embodiments of the invention. Each component is mapped to basic gates and flattened. To save time, the components may be selectively considered to ensure that a module that is instantiated several times with the same configuration (in terms of parameter values) is synthesized only once. Since no optimizations are performed (no optimizations in term of area, through selection of optimal gates and/or Boolean optimizations, and no optimizations in term of timing, even ignoring the timing of nets between gates, except if they are very long), the simplified synthesis enables very quick results that gives a first order approximation of timing and area. In addition, the synthesis of each NoC component individually makes the method much faster to perform than if the synthesis was done in context, with all the NoC components being synthesized at once. The gain in speed is very large, because each signal through the component is terminated at the component interfaces, instead of being continued to another component when the complete NoC is synthesized.

At block 550, a netlist is created by assembling individually synthesized components. The netlist identifies all combinational paths of gates between IOs and registers and all paths between registers. The netlist may be of EDA type by assembling the synthesized modules of block 540 and making use of the DAG from block 510.

At block 560, area numbers are reported. The area for the NoC may be measured by reporting all the gates and register instances on the EDA netlist from block 550 along with area associated with each basic primitive gates in term of unit area. The term "unit area" means that instead of using a specific number per gate (e.g., square micrometers) all gates have their areas normalized to the area of a reference cell, typically a 2-input NAND logic gate. Then all areas are reported as a multiple of that reference.

At block 570, timing paths are computed and delays are reported in accordance with various aspects and embodiments of the invention. Timing paths may be computed by tracing topological paths from output ports back to input ports of the design through registers and latches. Then, each path is sectioned to extract the three types of combinational paths: between input ports and output ports directly; between registers; and between registers and input and output ports. Once the paths are populated, they are sorted in descending order from longest to shortest. A delay for a combinational path is the accumulation of delays across the primitive gates. The longest paths are then considered (in term of number of primitive gates) because of their impact on operation frequency.

At block 580, a determination is made as to whether the timing and area constraints are violated in accordance with various aspects and embodiments of the invention. If there is no violation, then the method of FIG. 5 is completed, and export and generation are performed (block 460). If there is a violation, but the approximated area and timing are not close to the constraints, then control is returned to block 420, and the design of the NoC is modified. For example and in accordance with various aspects and embodiments of the invention, if an approximated value exceeds a corresponding constraint value by a margin of error (e.g., 30%), then control is returned to block 420.

If the constraints are violated, but the approximated area and timing are close to the constraints (e.g., an approximated value exceeds the constraint value, but falls within the margin of error), then incremental modifications to the NoC topology may be sufficient to fix the timing/area issues. The flow is incremental in that only the NoC components that are modified go through the flow again. Each incremental change may be performed according to blocks 590, 592, and 594.

At block 590, a subset of components is identified for modification in accordance with various aspects and embodiments of the invention. Primitive gates causing area and constraint violations can be traced to the components where those gates reside.

At block 592, parameter values of the identified components may be fine-tuned, either manually or automatically in accordance with various aspects and embodiments of the invention. At block 594, the modified components are synthesized, and the netlist is updated with the entries corresponding to modified components. Areas and timing of the updated netlist are reported (blocks 560 and 570) and once again compared to the constraints (block 580). If the approximated area and timing are trending in the right direction, the incremental modifications may continue until the constraints have been satisfied.

Figure 6A:
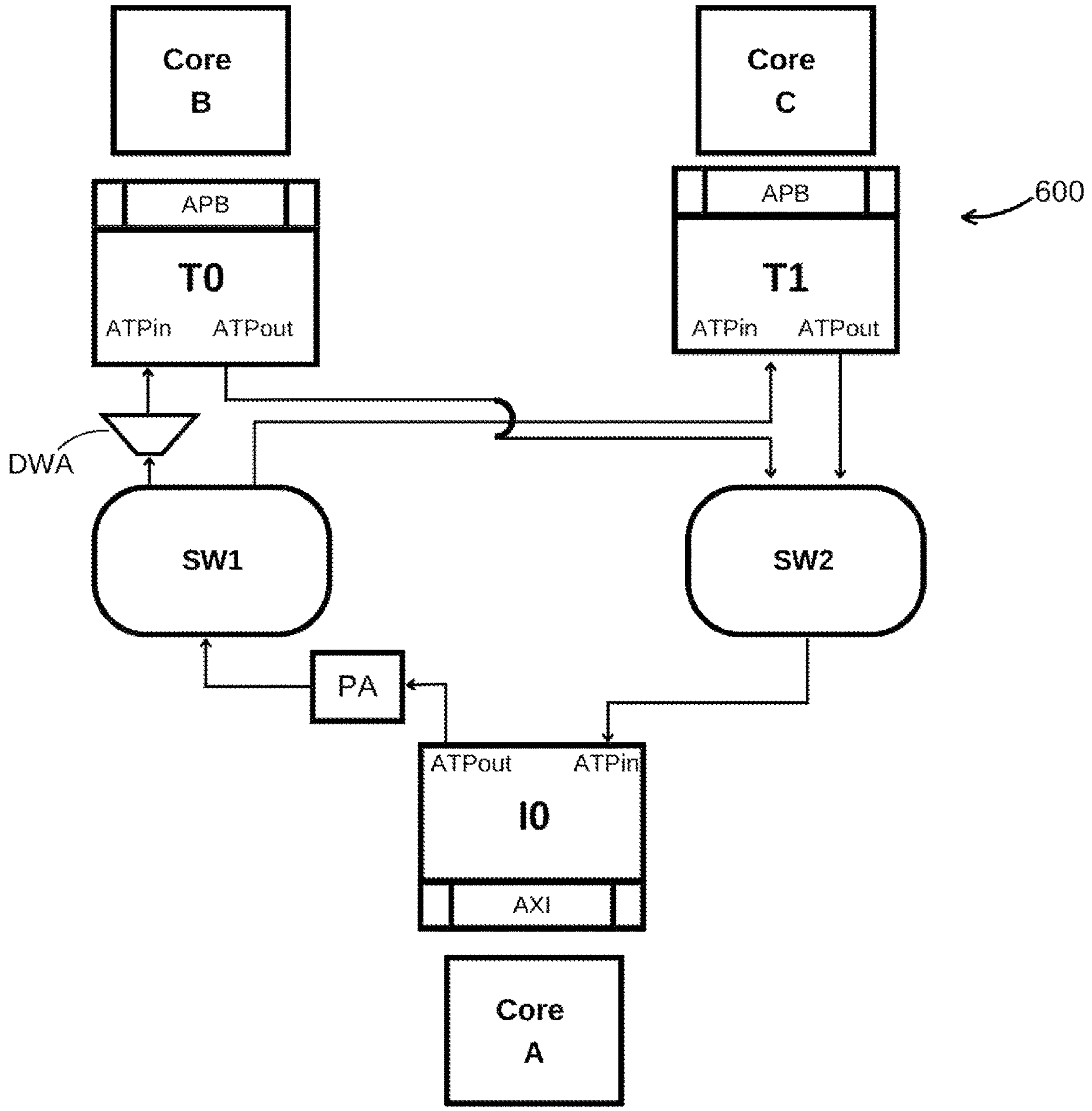
FIG. 6A shows a NoC topology in accordance with various aspects and embodiments of the invention.
Figure 6B:
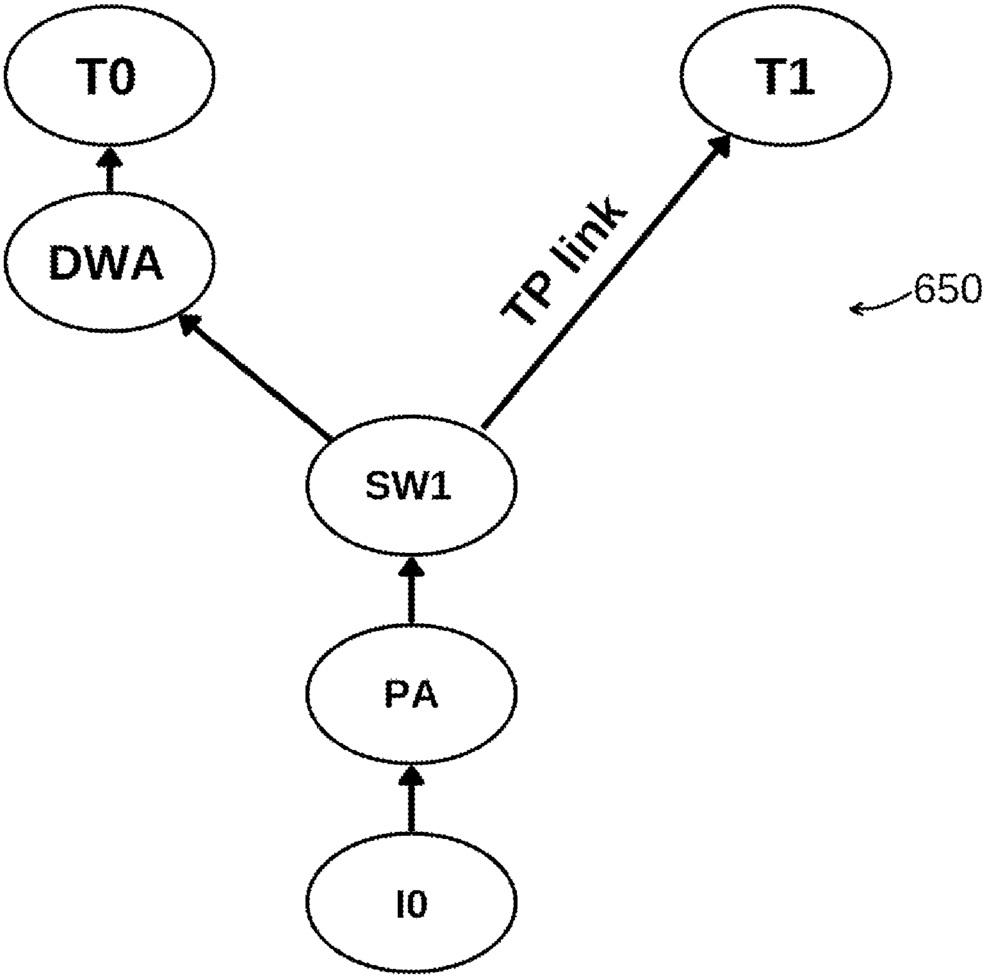
FIG. 6B shows a DAG for the NoC topology of FIG. 6A in accordance with various aspects and embodiments of the invention.
Figure 8:
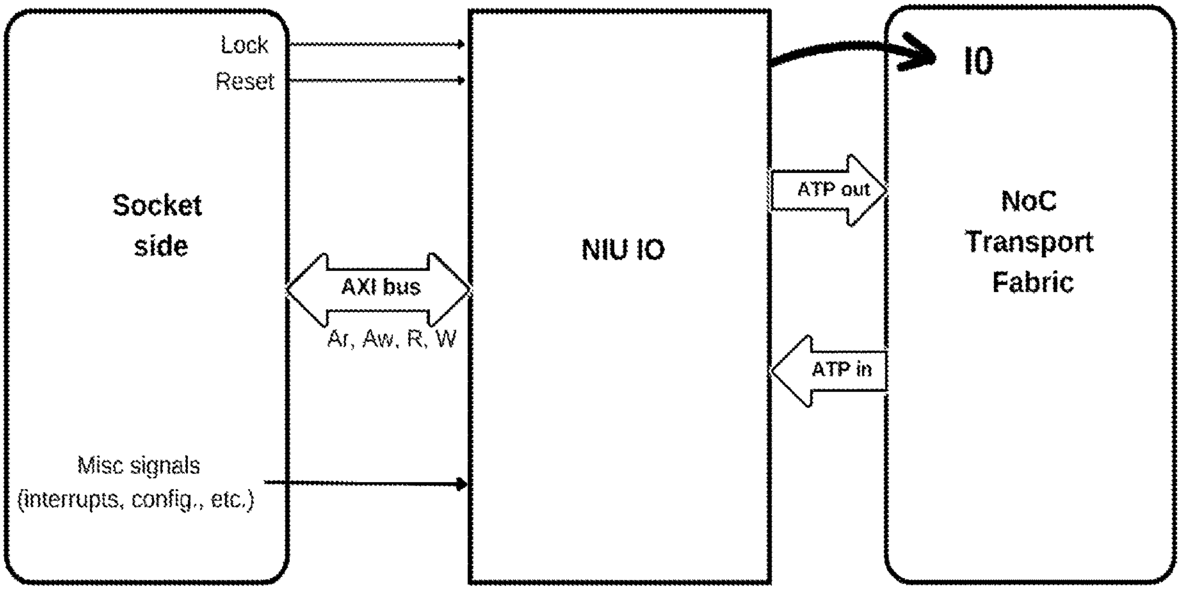
FIG. 8 shows a network interface unit (NIU) in accordance with various aspects and embodiments of the invention.

FIG. 6A illustrates a simple example of a NoC topology 600 that provides packet-based communication between Cores A, B and C; and FIGS. 6B to illustrate how the method of FIG. 5 may be used to generate an RTL description for the NoC topology of FIG. 6A. Core A is an initiator of data, and Cores B and C are targets of that data. An initiator NIU I0 communicates with Core A via a socket AXI. Target NIUs T0 and T1 communicate with cores B and C via sockets APB and APB. A pipe adapter PA, switch SW1 and width adapter DWA provide a communications path between the initiator NIU I0 and the target NIU TO. The pipe adapter PA and switch SW2 provide a communications path between the initiator NIU I0 and the target NIU T1. The switch SW2 provides a communication path from the target NIUs T0 and T1 to the initiator NIU I0. All components are connected through a transport protocol (TP) link interface. An example of such interface 710 on a pipe adapter is given in FIG. 7. The NIU I0 outward connectivity to sockets depends on the selected protocols by the NoC designer (AXI, APB, etc.), as depicted in FIG. 8. Thus, by knowing the port interface (which is defined by the TP protocol, as in the example of FIG. 7), the NoC can be composed by connecting the NoC component instances via the known port interface.

FIG. 6B shows a DAG 650 of the components I0, PA, SW1, DWA, T0 and T1 and connections from initiator NIU IO to target NIUs T0 and T1 (block 510).

RTLs are generated for each component I0, PA, SW1, DWA, T0 and T1 in the DAG 650 (block 520 and 530). The components I0, PA, SW1, DWA, T0 and T1 are then mapped to basic gates and flattened (block 540).

Figure 9:
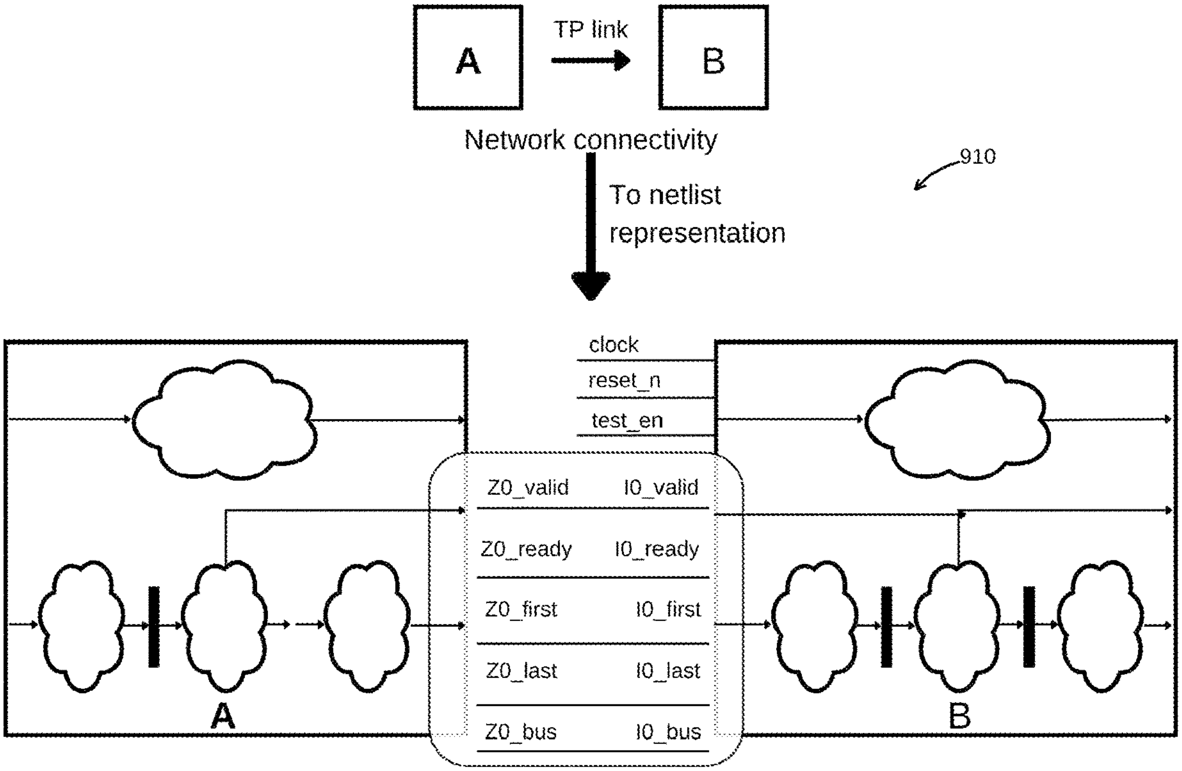
FIG. 9 shows a representation of connectivity of NoC components or elements through a transfer protocol interface in accordance with various aspects and embodiments of the invention.

An EDA netlist is created by assembling individually synthesized components (block 550). This may be performed by traversing the DAG, picking pairs of components connected by a TP link, creating TO in and TP out interfaces per component, connecting clocks to components, and creating nets between components. FIG. 9 shows a netlist representation 910 for connectivity between cores A and B is formed via a TP interface.

Area numbers are reported by reporting all the gates and register instances on the EDA netlist (block 560). Area could be modeled as an area number that directly matches the one in the technology library, or it could be modeled as <number of transistors>*<unit area of a transistor>, where number of transistors is predefined for each type of primitive, while unit area could be extracted from the technology library.

Timing paths are computed and delays are reported (block 570). Consider the gates illustrated in FIG. 10. Three types of timing paths—path(a), path(b), path (c)—are considered.

a. Path(a)—Combinational paths between PIs and POs directly (e.g., In1->i0->i1->i2->i3->out0).
b. Path(b)—Combinational paths between registers (e.g., DFF1/q->i4->i5->DFF2/d).
c. Path (c)—Combinational paths between PIs (resp. POs) and registers (e.g., in0->i1->DFF1/d or DFF2/q->i6->i7->out1).

Figure 10:
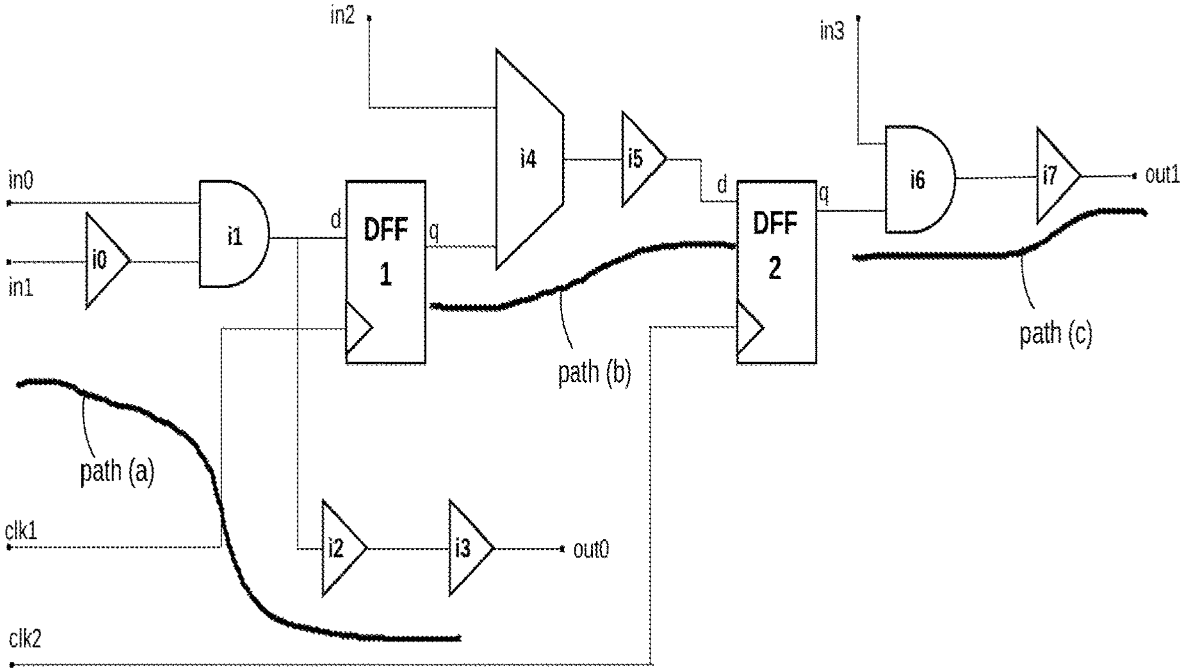
FIG. 10 shows how timing paths and delays may be determined in accordance with various aspects and embodiments of the invention.

The timing paths are placed in descending number of logical levels. The first k-longest paths will be used to determine delays and have a reference on how the implementation stands regarding the operating frequencies. The longest paths give an idea about the operation frequency which is basically computed as freq=1/(max delay of path). The information is also used as reference in an incrementation design methodology for fine-tuning and efficient hardware configuration (such as the enabling/disabling of pipelines in the NIUs or buffers on switches, etc.). In FIG. 10, path (a) is the longest.

If timing and area constraints are satisfied, the method is terminated (block 580). Otherwise, the topology is modified.

A method herein is not limited to a NoC implementation. Other types of implementations include, but are not limited to design implementations with configurable components, architecture prototyping and exploration.

Figure 11:
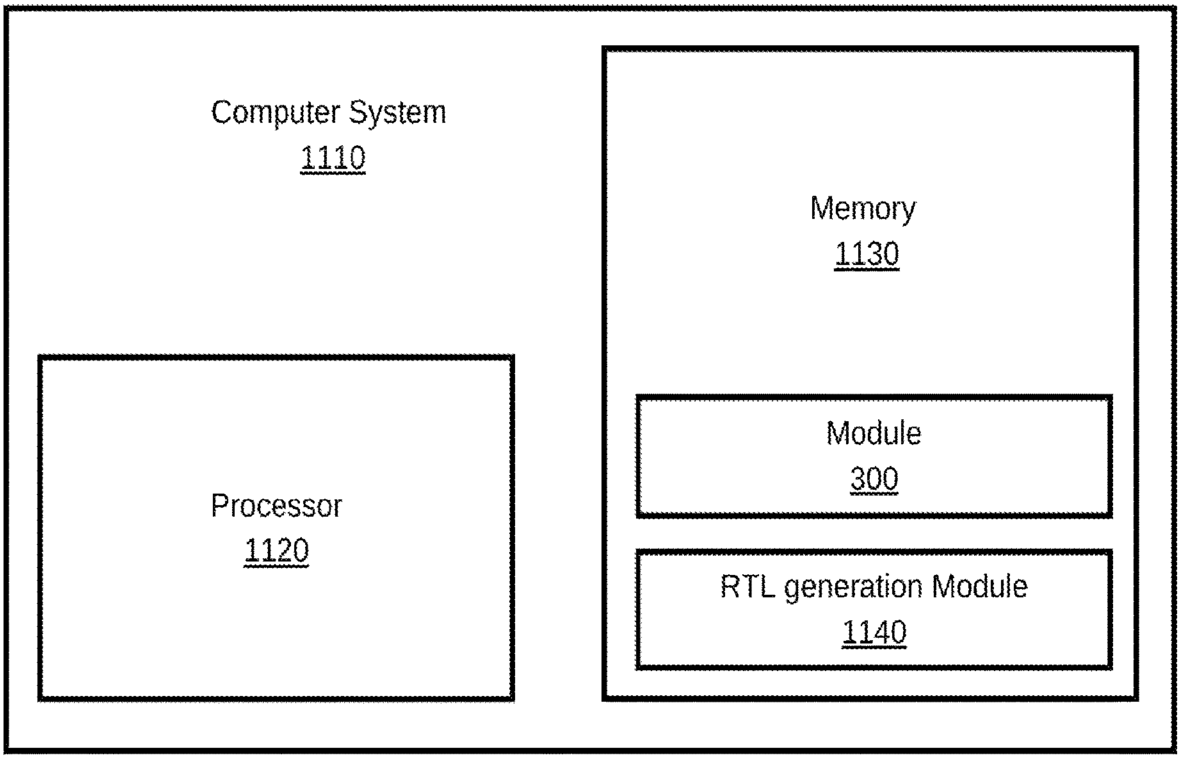
FIG. 11 shows systems for generating an RTL description of a NoC in accordance with various aspects and embodiments of the invention.

Reference is made to FIG. 11. A method herein may be performed by a computer system 1110 having a processor 1120 and computer-readable memory 1130. The memory 1130 stores, for example, the module 300 of FIG. 3. The module 300 includes executable instructions that, when executed, cause the processor 1120 to perform an approximation of area and timing of a NoC topology without optimization. The memory 1130 may also store an RTL generation module 1140 including executable instructions that, when executed, cause the processor 1120 to generate a complete RTL description whose area and timing approximations satisfy constraints.

Figure 12:
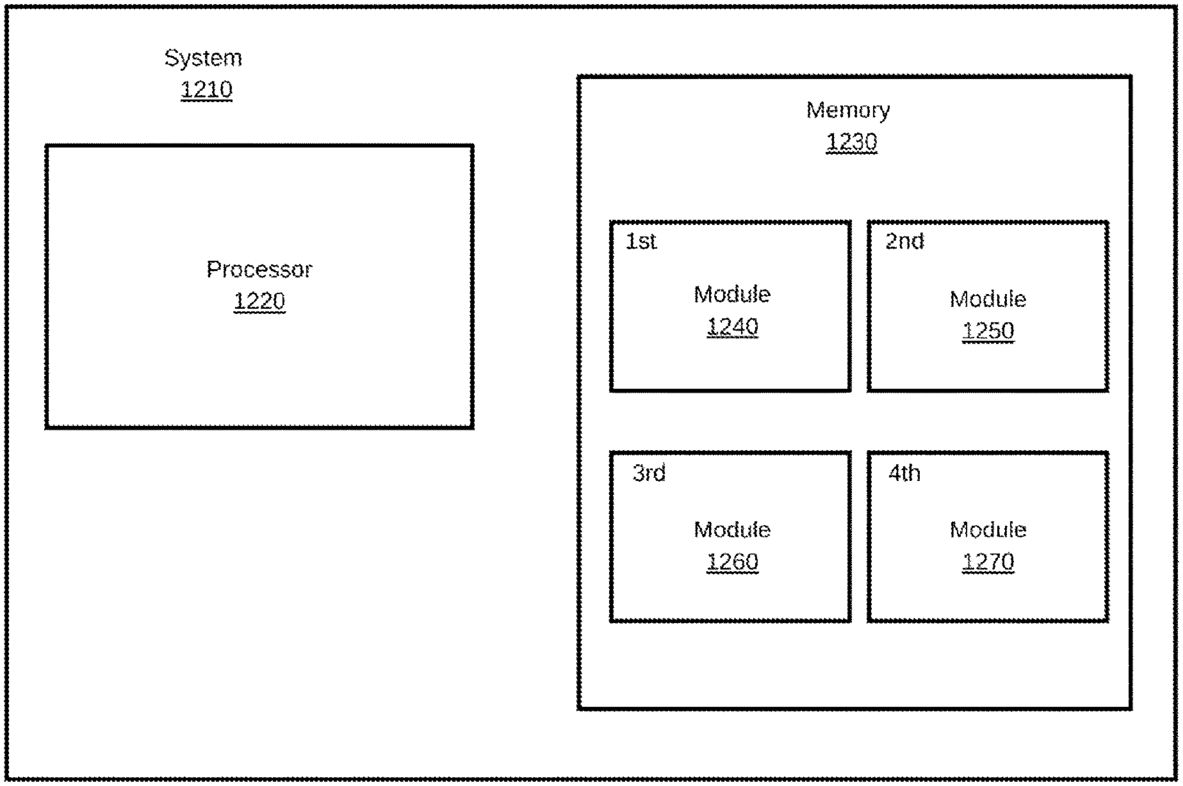
FIG. 12 show examples of systems for generating an RTL description of a NoC in accordance with various aspects and embodiments of the invention.

Reference is now made to FIG. 12 which illustrates another example of a system 1210 for implementing a method herein. The system 1210 includes a processor 1220 and processor-readable memory 1230. The processor 1220 is programmed to access a reduced library of gates for technology mapping. The memory 1230 stores modules 1240 to 1270. A first module 1240 includes executable instructions for causing the processor 1220 to receive NoC information. A second module 1250 includes executable instructions for causing the processor 1220 to synthesize NoC components individually. A third module 1260 includes executable instructions for causing the processor 1220 to build a path across multiple components separately, wherein components are individually considered for synthesis and assembled into net-lists for area and timing assessments. A fourth module 1270 includes executable instructions for causing the processor 1220 to generate a complete RTL description of the NoC if the area and timing assessments satisfy implementation constraints.

Accordingly, the preceding merely illustrates the various aspects and principles as incorporated in various embodiments of the invention. It will be appreciated that those of ordinary skill in the art will be able to devise various arrangements which, although not explicitly described or shown herein, embody the principles of the invention and are included within its spirit and scope. Furthermore, all examples and conditional language recited herein are principally intended to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

Unless defined otherwise, all technical and scientific terms used herein have the same meaning as commonly understood by one of ordinary skill in the art to which this invention belongs. The verb couple, its gerundial forms, and other variants, should be understood to refer to either direct connections or operative manners of interaction between elements of the invention through one or more intermediating elements, whether or not any such intermediating element is recited. Any methods and materials similar or equivalent to those described herein can also be used in the practice of the invention. Representative illustrative methods and materials are also described.

All publications and patents cited in this specification are herein incorporated by reference as if each individual publication or patent were specifically and individually indicated to be incorporated by reference and are incorporated herein by reference to disclose and describe the methods and/or system in connection with which the publications are cited. The citation of any publication is for its disclosure prior to the filing date and should not be construed as an admission that the invention is not entitled to antedate such publication by virtue of prior invention. Further, the dates of publication provided may be different from the actual publication dates which may need to be independently confirmed.

Additionally, it is intended that such equivalents include both currently known equivalents and equivalents developed in the future, i.e., any elements developed that perform the same function, regardless of structure. The scope of the invention, therefore, is not intended to be limited to the exemplary embodiments shown and described herein.

In accordance with the teaching of the invention a computer and a computing device are articles of manufacture. Other examples of an article of manufacture include: an electronic component residing on a mother board, a server, a mainframe computer, or other special purpose computer each having one or more processors (e.g., a Central Processing Unit, a Graphical Processing Unit, or a microprocessor) that is configured to execute a computer readable program code (e.g., an algorithm, hardware, firmware, and/or software) to receive data, transmit data, store data, or perform methods.

The article of manufacture (e.g., computer or computing device) includes a non-transitory computer readable medium or storage that may include a series of instructions, such as computer readable program steps or code encoded therein. In certain aspects of the invention, the non-transitory computer readable medium includes one or more data repositories. Thus, in certain embodiments that are in accordance with any aspect of the invention, computer readable program code (or code) is encoded in a non-transitory computer readable medium of the computing device. The processor or a module, in turn, executes the computer readable program code to create or amend an existing computer-aided design using a tool. The term "module" as used herein may refer to one or more circuits, components, registers, processors, software subroutines, or any combination thereof. In other aspects of the embodiments, the creation or amendment of the computer-aided design is implemented as a web-based software application in which portions of the data related to the computer-aided design or the tool or the computer readable program code are received or transmitted to a computing device of a host.

An article of manufacture or system, in accordance with various aspects of the invention, is implemented in a variety of ways: with one or more distinct processors or microprocessors, volatile and/or non-volatile memory and peripherals or peripheral controllers; with an integrated microcontroller, which has a processor, local volatile and non-volatile memory, peripherals and input/output pins; discrete logic which implements a fixed version of the article of manufacture or system; and programmable logic which implements a version of the article of manufacture or system which can be reprogrammed either through a local or remote interface. Such logic could implement a control system either in logic or via a set of commands executed by a processor.

Therefore, the scope of the invention is not intended to be limited to the various aspects and embodiments discussed and described herein. Rather, the scope and spirit of invention is embodied by the appended claims.

What is claimed is:

1. A computer-implemented method of designing a network on chip (NoC), the method comprising:

defining a topology of the NoC having a set of constraints;

approximating area and timing of components defined as part of the topology by mapping at least one synthesis primitive to each component of the topology based on at least one constraint provided for the topology; and generating a complete register transfer level (RTL) description of the topology if the approximated area and timing satisfy the constraints, wherein if the timing and area do not satisfy the constraints, then:

modifying the topology, including:

identifying a subset of components that contributed to constraint violations;

making incremental modifications to the components in the subset; and using the modified components in place of corresponding components in the topology to determine whether the constraints are satisfied;

performing the approximation of area and timing for the modified topology; and providing a complete RTL description of the modified topology once the area and timing constraints are satisfied.

2. A computer-implemented method of designing a network on chip (NoC), the method comprising:

defining a topology of the NoC having a set of constraints;

approximating area and timing of components defined as part of the topology by mapping at least one synthesis primitive to each component of the topology based on at least one constraint provided for the topology, including:

creating a connectivity DAG of the components including how the components are connected for data flow;

generating an RTL for each of the components;

synthesizing the RTL for each of the components into primitive gates;

creating a netlist of synthesized RTLs including:

traversing the connectivity DAG, creating, for each pair of components connected by a transfer protocol link in the connectivity DAG, in and out interfaces per component pair;

connecting clocks to the components in the pair; and creating networks between the components in the pair; and computing timing paths and areas from the netlist; and generating a complete register transfer level (RTL) description of the topology if the approximated area and timing satisfy the constraints.

3. A computer-implemented method of designing a network on chip (NoC), the method comprising:

defining a topology of the NoC having a set of constraints;

approximating area and timing of components defined as part of the topology by mapping at least one synthesis primitive to each component of the topology based on at least one constraint provided for the topology, including:

creating a connectivity DAG for components that includes data flow connection for each component;

generating an RTL for each component;

synthesizing the RTL for each component into primitive gates;

creating a netlist of the synthesized RTL; and computing timing paths and areas from the netlist; and generating a complete register transfer level (RTL) description of the topology if the approximated area and timing satisfy the constraints, wherein determining timing delays includes:

sorting the timing paths in the netlist in descending order from longest to shortest; and determining delays in the longest paths in terms of number of primitive gates.

4. The method of claim 3, wherein timing paths are considered for the timing delay determination:

combinational paths between PIs and POs directly;

combinational paths between registers; and combinational paths between PIs and registers.

* * * * *